(12) United States Patent
Leussler et al.

(10) Patent No.: US 9,983,279 B2
(45) Date of Patent: May 29, 2018

(54) RADIO FREQUENCY (RF) BIRDCAGE COIL WITH SEPARATELY CONTROLLED RING MEMBERS AND RUNGS FOR USE IN A MAGNETIC RESONANCE (MR) IMAGING SYSTEM

(71) Applicant: KONINKLIJKE PHILIPS N.V., Eindhoven (NL)

(72) Inventors: Christoph Leussler, Hamburg (DE); Jan Hendrik Wuelbern, Hamburg (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 405 days.

(21) Appl. No.: 14/437,137

(22) PCT Filed: Oct. 14, 2013

(86) PCT No.: PCT/IB2013/059335
§ 371 (c)(1),
(2) Date: Apr. 20, 2015

(87) PCT Pub. No.: WO2014/064573
PCT Pub. Date: May 1, 2014

(65) Prior Publication Data
US 2015/0276897 A1    Oct. 1, 2015

Related U.S. Application Data

(60) Provisional application No. 61/718,219, filed on Oct. 25, 2012.

(51) Int. Cl.
*G01R 33/34*     (2006.01)
*G01R 33/36*     (2006.01)
(Continued)

(52) U.S. Cl.
CPC ..... *G01R 33/34076* (2013.01); *G01R 33/365* (2013.01); *G01R 33/3614* (2013.01);
(Continued)

(58) Field of Classification Search
CPC ........ G01R 33/34046; G01R 33/34076; G01R 33/365; G01R 33/5659; G01R 33/3453;
(Continued)

(56) References Cited

U.S. PATENT DOCUMENTS 5,075,624 A * 12/1991 Bezjak ............. G01R 33/34046
324/318
5,132,621 A    7/1992 Kang et al.
(Continued)

FOREIGN PATENT DOCUMENTS

EP    1279968 A2    1/2003
WO    2006090293 A2    8/2006
(Continued)

OTHER PUBLICATIONS

Hayes, C. et al "An Efficient Highly Homogeneous Radiofrequency Coil for Whole-Body NMR Imaging at 1.5 T." Journal Magnetic Resonance, vol. 63, 1985, pp. 622-628.

*Primary Examiner* — Rishi Patel

(57) ABSTRACT

A radio frequency (RF) antenna device (40) applies an RF field to an examination space (16) of a magnetic resonance (MR) imaging system (10). The RF antenna device (40) includes a plurality of rungs (42, 44) arranged substantially parallel and in an azimuthally substantially equally spaced relationship along an outside of a virtual cylinder (50) with a cylinder axis (52) running parallel to main directions of extension (48). At least one transversal antenna member (54) electromagnetically is coupled to at least one rung (42, 44) of the plurality of rungs (42, 44). The at least one transversal antenna member (54) is arranged within a plane substan-
(Continued)

tially perpendicular to the main directions of extension (48) of the plurality of rungs (42, 44). At least one RF circuit (62, 64, 66) is provided for each rung (42, 44) of the plurality of rungs (42, 44) for mutual decoupling and for individually feeding RF power into the at least one transversal antenna member (54).

20 Claims, 7 Drawing Sheets

(51) Int. Cl.
 *H01Q 7/00* (2006.01)
 *G01R 33/565* (2006.01)
(52) U.S. Cl.
 CPC .......... *G01R 33/3628* (2013.01); *H01Q 7/00* (2013.01); *G01R 33/5659* (2013.01)
(58) Field of Classification Search
 CPC ............ G01R 33/3642; G01R 33/3678; G01R 33/3614; G01R 33/3628; H01Q 7/00
 See application file for complete search history.

(56) References Cited

U.S. PATENT DOCUMENTS

| | | | |
|---|---|---|---|
| 6,995,561 B2 | 2/2006 | Boskamp | |
| 7,075,302 B2 | 7/2006 | Zhu | |
| 7,279,901 B2 | 10/2007 | Diehl | |
| 7,538,552 B2 * | 5/2009 | Leussler | G01R 33/34046 |
| | | | 324/318 |
| 7,663,370 B2 | 2/2010 | Kroeckel | |
| 7,755,357 B2 | 7/2010 | Holle | |
| 8,035,378 B2 | 10/2011 | Schnell | |
| 2005/0127914 A1 * | 6/2005 | Eberler | G01R 33/34046 |
| | | | 324/318 |
| 2006/0033497 A1 | 2/2006 | Chmielewski | |
| 2008/0129294 A1 * | 6/2008 | Leussler | G01R 33/34046 |
| | | | 324/318 |

FOREIGN PATENT DOCUMENTS

| | | |
|---|---|---|
| WO | 2009074966 A1 | 6/2009 |
| WO | 2012143833 A1 | 10/2012 |

\* cited by examiner

RADIO FREQUENCY (RF) BIRDCAGE COIL WITH SEPARATELY CONTROLLED RING MEMBERS AND RUNGS FOR USE IN A MAGNETIC RESONANCE (MR) IMAGING SYSTEM

CROSS-REFERENCE TO PRIOR APPLICATIONS

This application is the U.S. National Phase application under 35 U.S.C. § 371 of International Application No. PCT/IB2013/059335, filed on Oct. 14, 2013, which claims the benefit of U.S. Provisional Patent Application No. 61/718,219, filed on Oct. 25, 2012. These applications are hereby incorporated by reference herein.

FIELD OF THE INVENTION

The invention pertains to a radio frequency (RF) antenna device for applying an RF field to an examination space of a magnetic resonance (MR) imaging system, and an MR imaging system employing at least one such RF antenna device.

BACKGROUND OF THE INVENTION

In the field of magnetic resonance (MR) imaging, and in particular for multi-transmit MR imaging applications, it is known to especially use two types of degenerate radio frequency (RF) coils as antennae for exciting nuclear spins within a subject of interest, usually a patient, and detecting signals from them. These antennae, birdcage coil and transverse electromagnetic (TEM) coil, are widely used for MR imaging in the very-high RF band (VHF) and are being introduced in commercial 3 T whole-body MR imaging scanners. The birdcage coil has multiple conductor rungs which are arranged around an examination region of the MR imaging scanner, extending parallel to a main magnetic field direction. The coils require individual RF power supply to provide acceptable clinical image quality due to individual dielectric loading by the subject of interest.

A degenerated birdcage coil consists of individual loops formed by rungs and ring members. Ring members and rungs are orthogonally arranged and naturally decoupled[1]. RF currents flowing in these loops can be controlled but mutual coupling may lead to high intra-channel RF power consumption, especially with an increasing number of channels.

[1] cf. Hayes C, Edelstein W, Schenck J, Mueller O, Eash M.: *An efficient, highly homogeneous radiofrequency coil for whole-body NMR imaging at 1.5 T*, J Magn Reson 1985; 63:622-628, or Tropp J.: *The theory of the bird-cage resonator*, J Magn Reson 1989; 82:51-62

With the advent of low-power multi-channel RF amplifiers, a total number of transmit channels is not limited by cost anymore. High count distributed RF amplifiers can supply body coils with high count of input ports to satisfy the increasing requirements of high field clinical applications.

Document EP 1 279968 A2 describes an example of a bodycoil with individually controlled RF currents in the rungs which enables to vary an RF field pattern of the birdcage coil ("RF shimming") for the purpose of homogeneity in the presence of dielectric loading of the subject of interest. It is desirable to avoid a high ratio of RF currents in ring members and rungs that may give rise to excessive currents in the ring members and high specific absorption rates (SAR) for the subject of interest which requires special attention. Further, it is also desirable to extend the scope of RF shimming for this type of RF coil.

SUMMARY OF THE INVENTION

It is therefore an object of the invention to provide a radio frequency (RF) antenna device for applying an RF field to an examination space of a magnetic resonance (MR) imaging system without an occurrence of excessive RF currents, with improved SAR control, and with improved RF shimming options.

In one aspect of the present invention, the object is achieved by the RF antenna device comprising a plurality of rungs made from an electrically conductive material, wherein each rung of the plurality of rungs has a main direction of extension, and wherein in an operational state, the main directions of extension of the plurality of rungs are arranged substantially parallel and in an azimuthally substantially equally spaced relationship along an outside of a virtual cylinder with a cylinder axis running parallel to the main directions of extension;

at least one transversal antenna member made from an electrically conductive material that is electromagnetically coupled to at least one rung of the plurality of rungs, wherein the at least one transversal antenna member, in the operational state, is arranged within a plane that is substantially perpendicular to the main directions of extension of the plurality of rungs; and a plurality of RF circuitries, wherein at least one RF circuitry of the plurality of RF circuitries is provided for each rung of the plurality of rungs for mutual decoupling and for individually feeding RF power into and for the at least one transversal antenna member for individually feeding RF power into.

The phrase "individually feeding RF power", as used in this application, shall be understood particularly as providing RF power to an object wherein amplitude and/or phase of the RF power is independent of an amplitude and/or a phase of RF power provided to another object. The virtual cylinder preferably has a circular cross-section, but any other cross-section like an ellipse may also be possible. The phrase "RF circuitry", as used in this application, shall be understood particularly to encompass RF circuitries comprising active RF components, passive RF components, and combinations of active and passive RF components.

By that, amplitude and phase of RF currents can actively be controlled not only in the rungs but also in the transversal antenna member, so that excessive currents in the transversal antenna member and high SAR rates can be avoided. Individual rungs and transversal antenna member can be driven by individual complex RF pulses, which may differ in phase, frequency, amplitude, and time. By way of example, interference issues with local receive antennae like cardiac coils due to excessive currents in the transversal antenna member can be solved. Moreover, an RF antenna device with extended options and range of RF shimming can be provided.

Preferably, the RF antenna device is provided to apply the RF field to the examination space for resonant excitation at a first time of operation, and is further provided for receiving magnetic resonance RF energy emitted by the nuclei within the subject of interest at another time of operation that is different from the first time of operation. In other words, the RF antenna device may be provided to function as an RF transmit antenna as well as an RF receive antenna. This may allow for a compact design and also for avoiding cross-coupling between the RF transmit antenna and the RF receive antenna.

In a further aspect of the invention, the at least one rung of the plurality of rungs is split into at least two rung elements that are aligned in series in the main direction of extension of the rung. This may beneficially provide further degrees of freedom in RF shimming in the main direction of extension of the rungs.

In a preferred embodiment, the at least one transversal antenna member has a substantially circular shape, which allows for a symmetric RF field pattern in the plane of the transversal antenna member.

In yet another preferred embodiment, the RF antenna device comprises at least two transversal antenna members that are substantially aligned on a virtual circular line lying in the plane. As RF power can individually be fed into the two transversal antenna members, an even wider scope of RF shimming and SAR control can be provided.

An even large scope of RF shimming and SAR control can be obtained by furnishing the RF antenna device with a plurality of transversal antenna members. In one embodiment, the plurality of transversal antenna members may substantially be aligned on one virtual circular line lying in the plane.

In still another preferred embodiment, the plurality of transversal antenna member is arranged to be aligned along at least two virtual circular lines, each virtual circular line lying in a plane, wherein the planes are arranged in parallel in a spaced manner in the main direction of extension. By that, RF currents in the rungs and in the transversal antenna members can be decoupled, allowing for a full control of RF current amplitudes, thereby solving the severe problem of excessive ring current in prior art MR body coils, and hence reducing SAR-related limitations.

In another aspect of the present invention, the number of rungs of the plurality of rungs equals the number of transversal antenna members arranged within the plane or within one of the planes. This may provide a similar range for RF shimming of the RF field in the main direction of extension of the rungs and directions perpendicular to that.

In another embodiment, each rung of the plurality of rungs is electromagnetically decoupled from one of the transversal antenna members arranged within one plane or within one of the planes, and each of the transversal antenna members is electromagnetically decoupled from one rung of the plurality of rungs, allowing for generating and shimming of RF field patterns that are substantially symmetric within a portion of the examination space enclosed by the RF antenna device. The phrase "decoupled from", as used in this application, shall be understood particularly such that an electromagnetic coupling is attenuated by at least a factor of two, and preferably by at least a factor of five in amplitude.

In another preferred embodiment, a decoupling location between each rung of the plurality of rungs to one of the transversal antenna members arranged within one plane or within one of the planes, and a decoupling location between each of the transversal antenna members to one rung of the plurality of rungs is provided at a center portion of the respective transversal antenna members and an end portion of the respective rung. The phrase "center portion", as used in this application, shall be understood particularly as a portion of the transversal antenna member that comprises a center section of one third of a dimension of the transversal antenna member in a main direction of extension. Likewise, the phrase "end portion", as used in this application, shall be understood particularly as a portion of rung that comprises an end section of one third of a dimension of the rung in the main direction of extension of the rung. An RF field pattern of a birdcage coil mode configured in the well-known "T-type" configuration that is shimmed to perfection, with a controlled ratio of RF currents in the transversal antenna members and the rungs, preventing excessive RF currents in the transversal antenna members, can be accomplished by this.

Alternatively, in another embodiment a location of the electromagnetic coupling of each rung of the plurality of rungs to two of the transversal antenna members and each of the transversal antenna members to two rungs of the plurality of rungs is arranged at an end portion of the respective transversal antenna members and an end portion of the respective rung. The rungs are azimuthally aligned exactly at a gap between two transversal antenna members. This is called a "C-type" configuration for obvious reasons. In principle, any other azimuthal alignment of the transversal antenna members between the "T-type" configuration and the "C-Type" configuration is also possible.

In another aspect of the present invention, each of the RF circuitries of the plurality of RF circuitries comprises at least one RF source that is provided for applying RF power to at least one out of a rung of the plurality of rungs or the at least one transversal antenna member. Thereby, a flexible control of an input RF amplitude, RF phase, and individual complex RF pulses can be provided to each rung of the plurality of rungs and to each transversal antenna member, allowing for individually controlled RF amplitudes and phase settings.

In a further aspect of the invention, the RF antenna device comprises a single RF source and at least one RF power divider, wherein the single RF source is provided for individually feeding RF power to the plurality of rungs and to at least one transversal antenna member via the at least one RF power divider, thereby providing a fixed relation of the phases and amplitudes of the RF power fed into the plurality of rungs and into at least one transversal antenna member.

Generally, any combination of a number of RF sources, wherein each of the RF sources is provided for applying RF power to one of the RF circuitries, and RF sources with RF power dividers, wherein each RF source and RF power divider is provided for individually feeding RF power into at least one rung of the plurality of rungs and into at least one transversal antenna member, is a potential embodiment in accordance with the invention.

In a preferred embodiment, the rungs and the transversal antenna members of the RF antenna device are designed as TEM-type resonator strips. Thereby, the RF antenna device and related RF cable connections can be put into practice in a cost-effective way.

It is another object of the invention to provide a magnetic resonance (MR) imaging system, comprising:

a main magnet for generating a substantially static magnetic field;

a magnetic gradient coil system for generating gradient magnetic fields superimposed to the static magnetic field;

an examination space provided to position a subject of interest within;

at least one of the above-disclosed embodiments of an RF antenna device that is provided for applying an RF field to the examination space to excite nuclei of the subject of interest. The MR imaging systems shall also encompass diagnostic and therapy systems in which an MR imaging system is used as guidance for a medical tool, such as MRI-LINACs, MRI-Hyperthermia systems, MR-ET systems, and other interventional devices.

BRIEF DESCRIPTION OF THE DRAWINGS

These and other aspects of the invention will be apparent from and elucidated with reference to the embodiments described hereinafter. Such embodiment does not necessarily represent the full scope of the invention, however, and reference is made therefore to the claims and herein for interpreting the scope of the invention.

In the drawings.

DETAILED DESCRIPTION OF EMBODIMENTS

This description contains several embodiments of the invention. The individual embodiments are described with reference to particular groups of figures and are identified by a prefix number of the particular embodiment. Features whose function is the same or basically the same in all embodiments are identified by reference numbers made up of the prefix number of the embodiment to which it relates, followed by the number of the feature.

Figure 1:
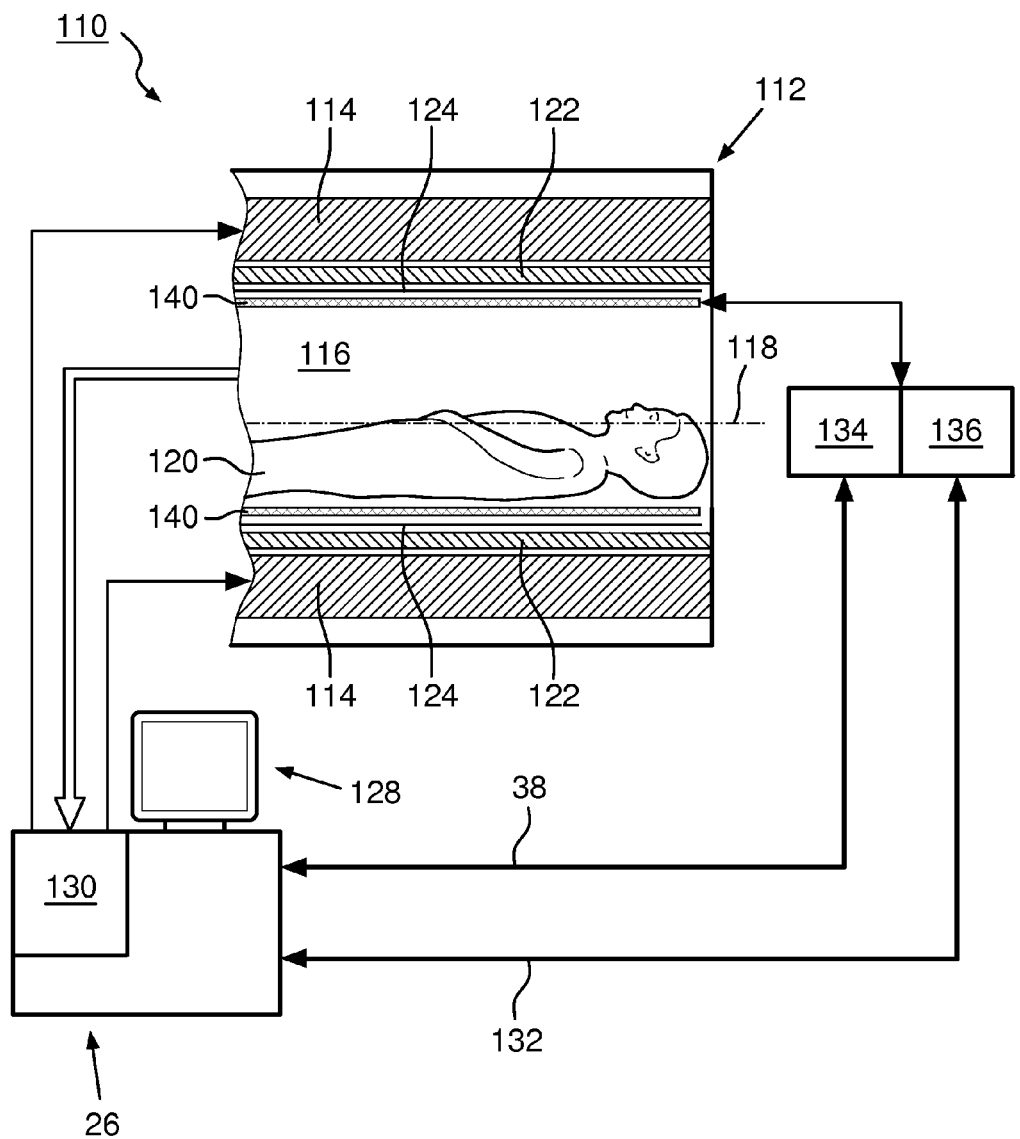
FIG. 1 is a schematic illustration of a part of an embodiment of an MR imaging system including a radio frequency (RF) antenna device in accordance with the invention.

FIG. 1 shows a schematic illustration of a part of an embodiment of a magnetic resonance (MR) imaging system 110 comprising an MR scanner 112. The MR imaging system 110 includes a main magnet 114 provided for generating a substantially static magnetic field. The main magnet 114 has a central bore that provides an examination space 116 around a center axis 118 for a subject of interest 120, usually a patient, to be positioned within. In principle, the invention is also applicable to any other type of MR imaging system providing an examination region within a static magnetic field. Further, the MR imaging system 110 comprises a magnetic gradient coil system 122 provided for generating gradient magnetic fields superimposed to the static magnetic field. The magnetic gradient coil system 122 is concentrically arranged within the bore of the main magnet 114, as is well known in the art.

Further, the MR imaging system 110 includes a radio frequency (RF) antenna device 140 designed as a whole-body coil that is provided for applying an RF magnetic field to the examination space 116 during RF transmit phases to excite nuclei of the subject of interest 120. The RF antenna device 140 is also provided to receive MR signal from the excited nuclei during RF receive phases. In a state of operation of the MR imaging system 110, RF transmit phases and RF receive phases are taking place in a consecutive manner. The RF antenna device 140 is arranged concentrically within the bore of the main magnet 114. As is known in the art, a cylindrical metal RF screen 124 is arranged concentrically between the magnetic gradient coil system 122 and the RF antenna device 140.

Moreover, the MR imaging system 110 comprises an MR image reconstruction unit 130 provided for reconstructing MR images from the acquired MR signals and an MR imaging system control unit 26 with a monitor unit 128 provided to control functions of the MR scanner 112, as is commonly known in the art. Control lines 132 are installed between the MR imaging system control unit 26 and an RF transmitter unit 134 that is provided to feed RF power of an MR radio frequency to the RF antenna device 140 via an RF switching unit 136 during the RF transmit phases. The RF switching unit 136 in turn is also controlled by the MR imaging system control unit 26, and another control line 138 is installed between the MR imaging system control unit 126 and the RF switching unit 136 to serve that purpose. During RF receive phase, the RF switching unit 136 directs the MR signals from the RF antenna device 140 to the MR image reconstruction unit 130.

Figure 2:
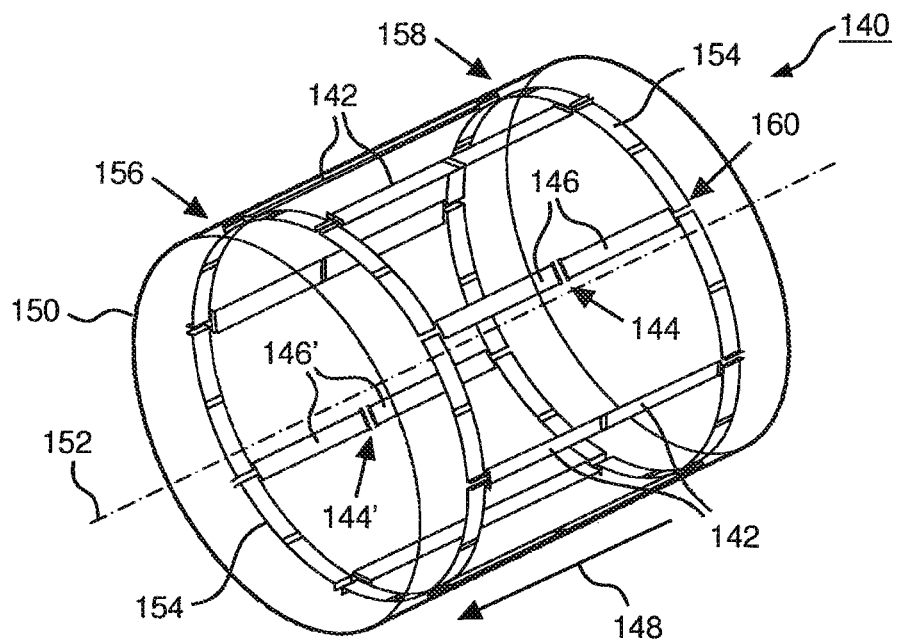
FIG. 2 is a 3-D view of the RF antenna device pursuant to the embodiment of FIG. 1.

FIG. 2 is a 3-D view of the RF antenna device 140 pursuant to the embodiment of FIG. 1. The RF antenna device 140 comprises a plurality of eight rungs 142, 144 that are designed as TEM-type resonator strips made from an electrically conductive material which is copper. Each of the rungs 142, 144 of the plurality of eight rungs 142, 144 has a main direction of extension 148. Two of the rungs 144, 144' are split into two rung elements 146, 146' each that are aligned in series in the main direction of extension 148 of the respective rung 144, 144'.

In an operational state as shown in FIG. 2, the main directions of extension 148 of the plurality of eight rungs 142, 144 are arranged parallel and in an azimuthally equally spaced relationship along an outside of a virtual cylinder 150 having a circular cross-section and a cylinder axis 152 running parallel to the main direction of extension 148. With respect to the MR imaging scanner 112, in the operational state the RF antenna device 140 is arranged such that the cylinder axis 152 coincides with the MR imaging scanner center axis 118.

Further, the RF antenna device 140 comprises a plurality of sixteen transversal antenna members 154. The sixteen transversal antenna members 154 are also designed as TEM-type resonator strips made from an electrically conductive material which is copper. Each of the transversal antenna members 154 is evenly curved along a direction of extension so that midlines of the resonator strips form a segment of a circle. The plurality of sixteen transversal antenna members 154 is arranged in two groups 156, 158 of eight. Each of the groups 156, 158 of eight transversal antenna members 154 is arranged such that the midlines of the transversal antenna members 154 are aligned on a virtual circular line. Each of the two virtual circular lines lies within a plane that is perpendicularly arranged with respect to the main directions of extension 148 of the plurality of eight rungs 142, 144. The two planes are arranged in parallel in a spaced manner in the main direction of extension 148.

By this arrangement, the number of rungs 142, 144 of the plurality of rungs 142, 144 equals the number of transversal antenna members 154 arranged within a plane or within one of the planes. By geometry, each rung 142, 144 of the plurality of rungs 142, 144 is electromagnetically coupled to two of the transversal antenna members 154 arranged within one of the planes, and each of the transversal antenna members 154 arranged within one of the planes is electromagnetically coupled to two rungs 142, 144 of the plurality of rungs 142, 144. A decoupling location 160 of the electromagnetic coupling between each rung 142, 144 of the plurality of rungs 142, 144 to two of the transversal antenna members 154 arranged within one of the planes, and each of the transversal antenna members 154 to two rungs 142, 144 of the plurality of rungs 142, 144 is provided at end portions of the two respective transversal antenna members 154 and an end portion of the respective rung 142, 144 ("C-type" arrangement). For clarity reasons, only one decoupling location 160 is marked in FIG. 2. Decoupling of the individual antenna members 154 can be accomplished by overlapping of adjacent TEM structures, by employing inductive transformers or capacitive networks, as is known in the art.

Dimensions of the rungs 142, 144 and the transversal antenna members 154 are designed so as to provide an opening by the plurality of rungs 142, 144 and the plurality of the transversal antenna members 154 that enables a human subject of interest 120 to be arranged within.

Figure 3:
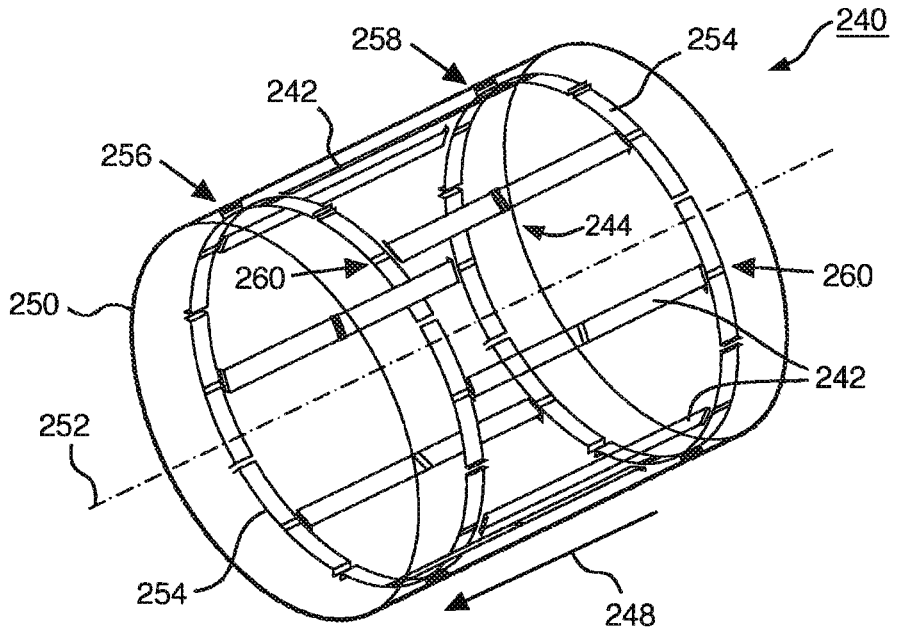
FIG. 3 is a 3D-view of an alternative embodiment of an RF antenna device in accordance with the invention.

FIG. 3 is a 3D-view of an alternative embodiment of an RF antenna device 240 in accordance with the invention. Components of the RF antenna device 240 are identical to those of the embodiment pursuant to FIG. 2. In contrast to this earlier embodiment, in the arrangement of FIG. 3, a location 260 of the electromagnetic coupling of each rung 242, 244 of the plurality of rungs 242, 244 to one of the transversal antenna members 254 arranged within one of the planes, and each of the transversal antenna members 254 arranged within one of the planes to one rung 242, 244 of the plurality of rungs 242, 244 is located at a center portion of the respective transversal antenna member 254 and an end portion of the respective rung 242, 244 ("T-type" arrangement). Also, the rungs 242, 244 of the plurality of rungs 242, 244 are not split. For clarity reasons, only one coupling location 260 is marked in FIG. 3.

Figure 4:
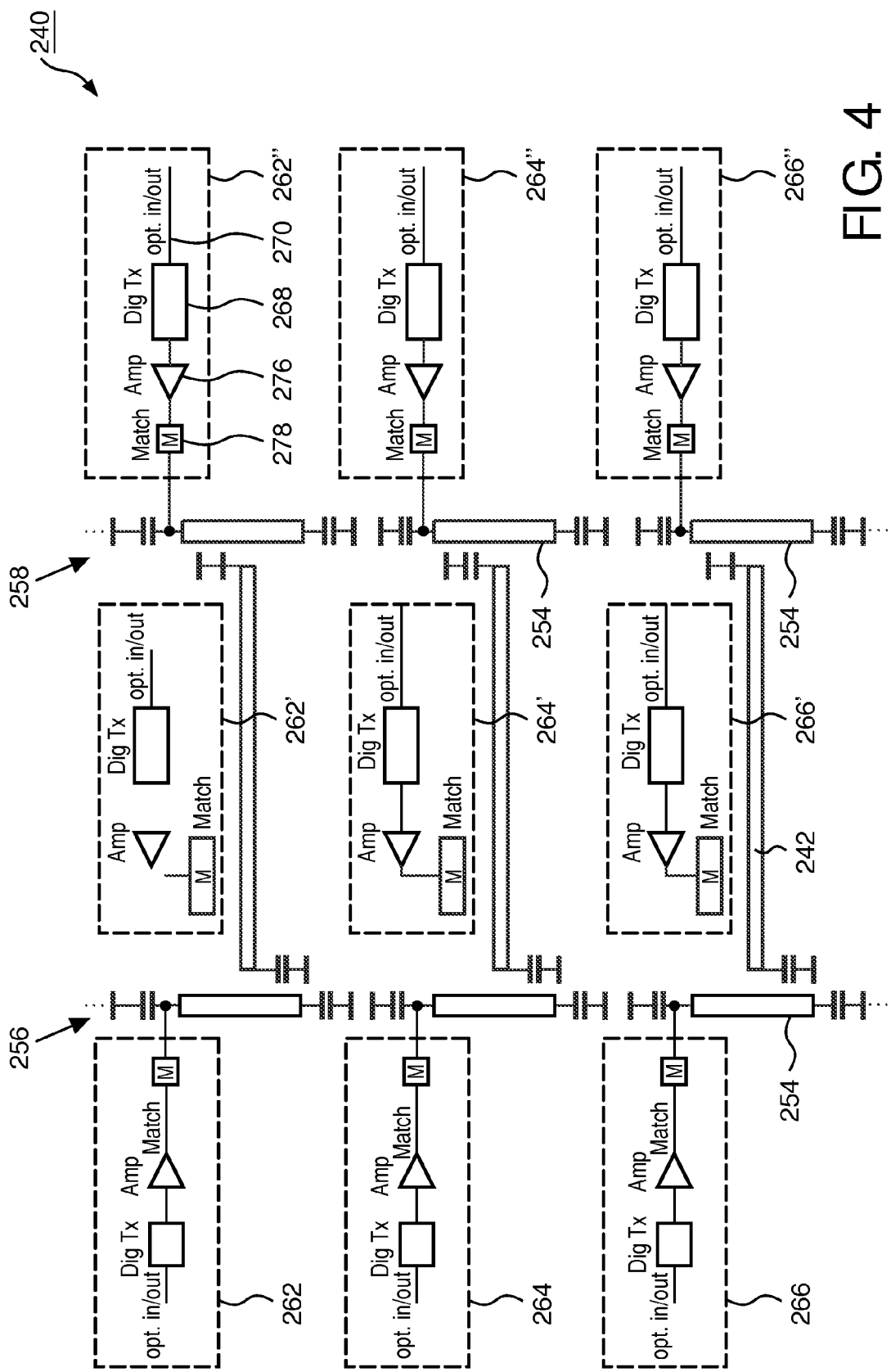
FIG. 4 illustrates an RF circuitry for operating the RF antenna device pursuant to the embodiment of FIG. 3.

FIG. 4 illustrates RF circuitries 262, 264, 266 for operating the RF antenna device 240 pursuant to the embodiment of FIG. 3. The RF antenna device 240 comprises a plurality of 24 RF circuitries 262, 264, 266 (nine of them shown in FIG. 4). One RF circuitry 262, 264, 266 of the plurality of RF circuitries 262, 264, 266 is provided for each rung 242, 244 of the plurality of rungs 242, 244 for mutual decoupling and for individually feeding RF power into and for the at least one transversal antenna member 254 for individually feeding RF power into. The RF circuitries 262, 264, 266 are identically designed and comprise a digital transmitter 268 having a fiber-optic control line 270, an amplifier 276, and a passive impedance matching circuit 278. Each combination of one of the RF circuitries 262, 264, 266 and one of the rungs 242, 244 or one of the transversal antenna members 254 represents an RF transmit/receive channel that is independently controllable with regard to RF amplitude, RF phase, and complex RF pulses that are individual with respect to phase, amplitude, frequency, and time, and that are employed in parallel imaging techniques such as SENSE (Sensitivity Encoding) that are well known to the one skilled in the art.

Figure 5:
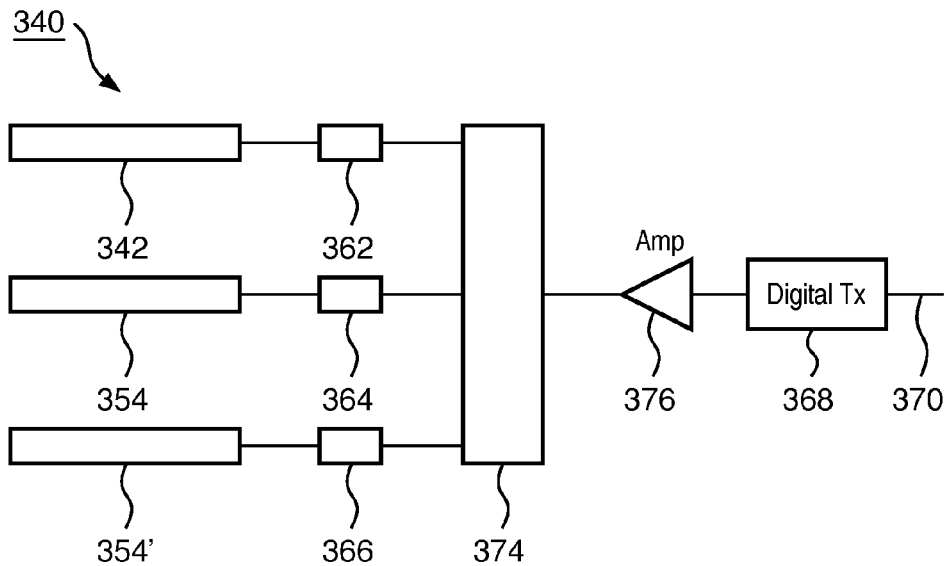
FIG. 5 illustrates an alternative RF antenna device in accordance with the invention.

FIG. 5 illustrates an alternative RF antenna device 340 in accordance with the invention. Herein, a first and second transversal antenna member 354, 354' are designed to have a substantially circular shape. The RF antenna device 340 comprises a single RF source 372 and at least one RF power divider 374, wherein the single RF source 372 is provided for individually feeding RF power to the plurality of rungs 342, 344, to the first transversal antenna member 354, and to the second transversal antenna member 354' via the at least one RF power divider 374 and via RF circuitries 362, 364, 366, each comprising a passive RF impedance circuit. Thereby, a fixed relation of phases and amplitudes of the RF power fed into the plurality of rungs 342, 344 and into the first transversal antenna member 354 and the second transversal antenna member 354' is provided.

Figure 6:
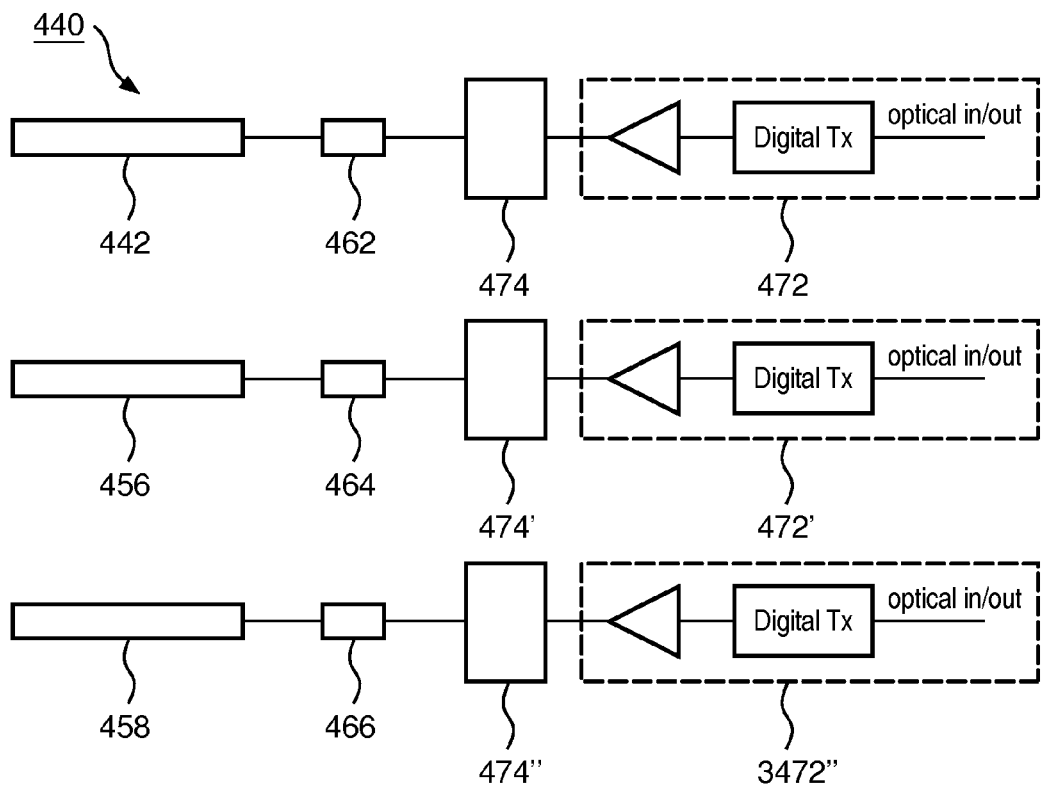
FIG. 6 illustrates yet another alternative RF antenna device in accordance with the invention.

FIG. 6 illustrates yet another alternative RF antenna device 440 in accordance with the invention. The way of operating the RF antenna device 440 as shown in FIG. 6 is called the "birdcage compatibility mode", for reasons that will become obvious. The RF antenna device 440 is operated such that the first group of eight transversal antenna members 456, the second group of eight transversal antenna members 458, and the plurality of rungs 442 are separately driven using three RF power dividers 474; 474' 474" that are each supplied with RF power by an independent RF source 472, 472', 472". This setup can emulate a perfect birdcage coil mode with a controlled ratio of an RF current flowing through the transversal antenna members 454 and an RF current flowing through the rungs 442. This mode prevents excessive RF currents through the transversal antenna members 454, which may appear in fully-coupled birdcage resonators and which are responsible for high local SAR regions. The configuration may therefore circumvent SAR limitations encountered in conventional birdcage coils. The three independent RF sources 472, 472', 472" provide correct RF phase offsets and RF amplitudes via the RF power dividers 474; 474' 474" and via the RF circuitries 462, 464, 466, each comprising a passive RF impedance circuit.

Figure 7:
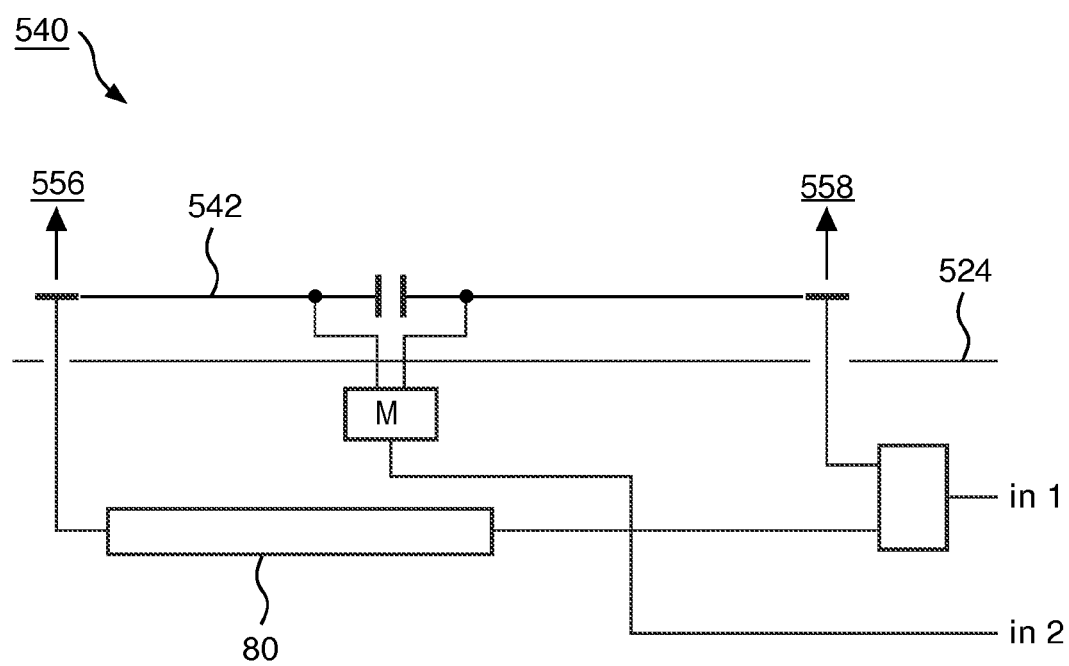
FIG. 7 depicts a fourth alternative of an RF antenna device in accordance with the invention.

FIG. 7 illustrates yet another alternative RF antenna device 540 in accordance with the invention that is provided for being operated in a birdcage compatibility mode using two RF channels. The two groups 556, 558 of eight transversal antenna members are connected via a transmission line 80 located outside of the RF screen 524, and are driven by a first RF channel with fixed amplitudes and phase relations. The plurality of rungs 542 is driven by a second RF channel.

Figure 8C:
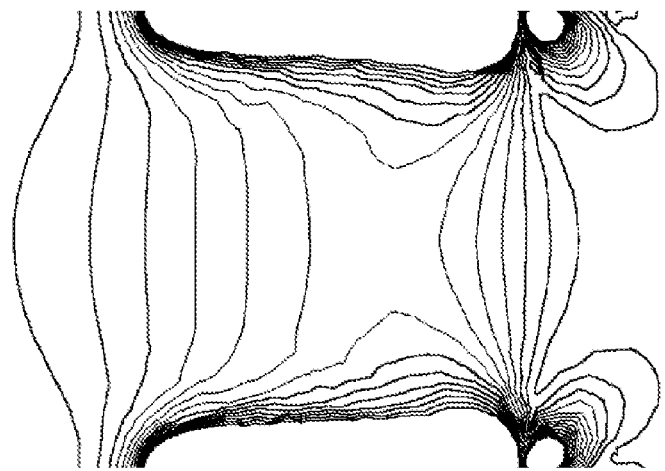
FIGS. 8(a)-8(c) shows a magnetic field part of the RF field pattern generated by the RF antenna device pursuant to FIG. 3 operated with various types of RF circuitry.
Figure 8B:
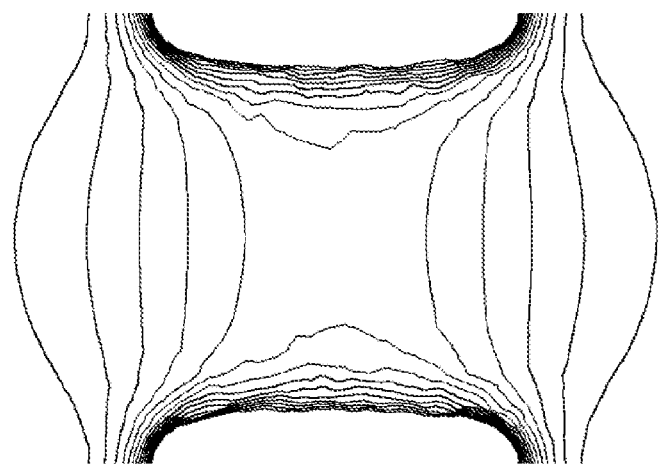
Figure 8A:
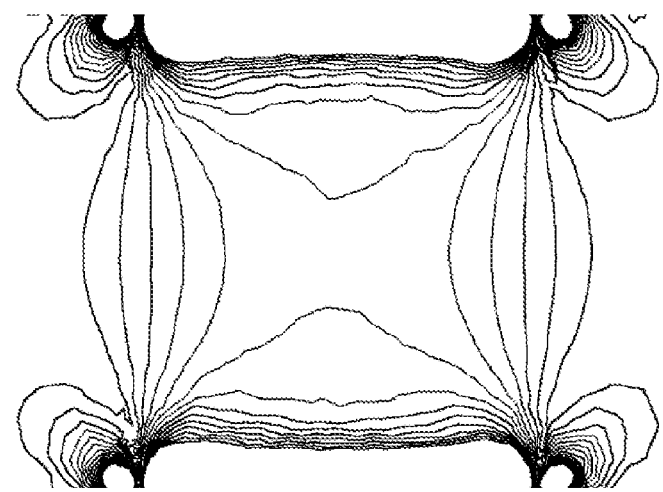

FIGS. 8(a)-8(c) show a magnetic field (B+) part of the RF field pattern generated by the embodiment of the RF antenna device 240 pursuant to FIG. 3 operated with various types of RF circuitries to illustrate shimming ability of an RF antenna device in accordance with the invention. In these examples, the RF antenna device 240 can be driven to perform like a TEM or birdcage coil, or any desired intermediate state.

Figure 8D:
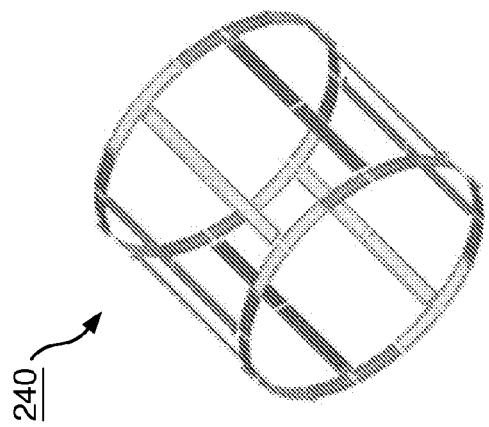
FIGS. 8(d)-8(f) illustrate surface current densities in the RF antenna devices for generating the magnetic field part of the RF field patterns pursuant to FIGS. 8(a)-8(c)
Figure 8E:
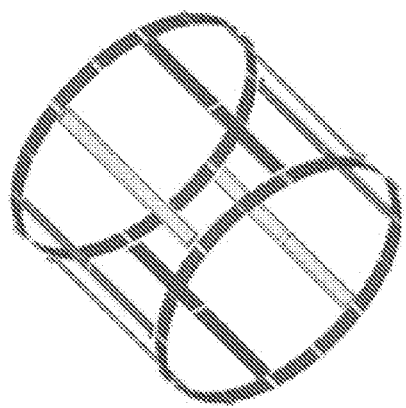
Figure 8F:
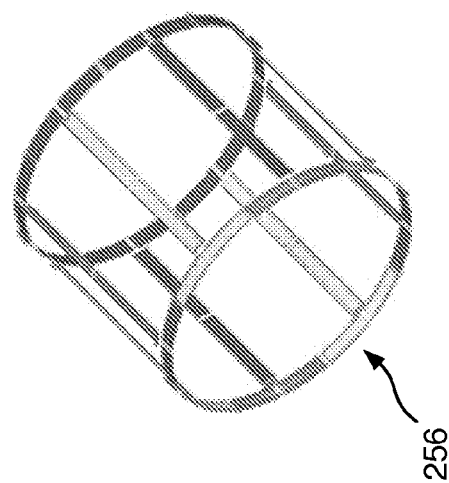

FIG. 8 illustrates B+ field patterns in the x,z-plane (FIGS. 8(a)-8(c)) and surface RF currents (FIGS. 8(d)-8(f)) for various drive configurations. In FIGS. 8(d)-8(f), the shading corresponds to an amplitude of a surface current density; the darker the shading, the larger is the amplitude of the current density. The empty RF antenna device 240 is driven to emulate a birdcage behavior (FIGS. 8(a), 8(d)) or a TEM (FIGS. 8(b), 8(e)) behavior. In the final example only one of the groups of transversal antenna members 256 is provided with RF power, yielding an asymmetric field distribution in z-direction (FIGS. 8(c), 8(f)).

This demonstrates that RF antenna devices 140-540 in accordance with the invention offer a greatly increased flexibility and RF shimming scope compared to conventional body coils. As another example, a total width of the field of view in the z-direction may be altered simply by switching between different RF drive settings. Alternatively, a relative position of the field of view may be selected.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST 10 magnetic resonance (MR) imaging system
12 MR scanner
14 main magnet
16 examination space
18 center axis
20 subject of interest
22 magnetic gradient coil system
24 RF screen
26 MR imaging system control unit
28 monitor unit
30 MR image reconstruction unit
32 control line
34 RF transmitter unit
36 RF switching unit
38 control line
40 radio frequency (RF) antenna device
42 rung
44 rung
46 rung element
48 main direction of extension
50 virtual cylinder
52 cylinder axis
54 transversal antenna member
56 group of eight
58 group of eight
60 coupling location
62 RF circuitry
64 RF circuitry
66 RF circuitry
68 digital transmitter
70 fiber-optic control line
72 RF source
74 RF power divider
76 amplifier
78 impedance matching circuit
80 transmission line

The invention claimed is:

1. A radio frequency antenna device for applying an RF field to an examination space of a magnetic resonance (MR) imaging system, the RF antenna device comprising:
   a plurality of rungs made from an electrically conductive material, wherein each rung of the plurality of rungs has a main direction of extension, and wherein in an operational state, the main directions of extension of the plurality of rungs are arranged substantially parallel and in an azimuthally substantially equally spaced relationship along an outside of a virtual cylinder with a cylinder axis running parallel to the main directions of extension;
   at least one transversal antenna member made from an electrically conductive material, wherein the at least one transversal antenna member, in the operational state, is arranged within a plane that is substantially perpendicular to the main directions of extension of the plurality of rungs; and
   a plurality of RF circuitries, wherein at least one RF circuitry of the plurality of RF circuitries is provided for each rung of the plurality of rungs for mutual decoupling each rung from the at least one transversal antenna member and for individually feeding RF power into the rung and wherein at least one of the RF circuitries is configured for individually feeding RF power into the at least one transversal antenna member.

2. The radio frequency antenna device as claimed in claim 1, wherein at least one rung of the plurality of rungs is split into at least two rung elements that are aligned in series in the main direction of extension of the rung.

3. The radio frequency antenna device as claimed in claim 1, wherein the at least one transversal antenna member has a substantially circular shape.

4. The radio frequency antenna device as claimed in claim 1, comprising at least two transversal antenna members that are substantially aligned on a virtual circular line lying in the plane.

5. The radio frequency antenna device as claimed in claim 1, comprising a plurality of transversal antenna members.

6. The radio frequency antenna device as claimed in claim 5, wherein the plurality of transversal antenna members is arranged to be aligned along at least two virtual circular lines, each virtual circular line lying in a plane, wherein the planes are arranged in parallel in a spaced manner in the main direction of extension.

7. The radio frequency antenna device as claimed in claim 1, wherein the number of rungs of the plurality of rungs equals the number of transversal antenna members arranged within a plane or within one of the planes.

8. The radio frequency antenna device as claimed in claim 7, wherein each rung of the plurality of rungs is electromagnetically decoupled from one of the transversal antenna members arranged within one plane or within one of the planes, and each of the transversal antenna members is electromagnetically decoupled from one rung of the plurality of rungs.

9. The radio frequency antenna device as claimed in claim 8, wherein a decoupling location between each rung of the plurality of rungs to one of the transversal antenna members arranged within one plane or within one of the planes, and a decoupling location between each of the transversal antenna members to one rung of the plurality of rungs is provided at a center portion of the respective transversal antenna members and an end portion of the respective rung.

10. The radio frequency antenna device as claimed in claim 1, wherein each of the RF circuitries of the plurality of RF circuitries comprises at least one RF source that is provided for applying RF power to at least one out of a rung of the plurality of rungs or the at least one transversal antenna.

11. The radio frequency antenna device as claimed in claim 7, further comprising a single RF source and at least one RF power divider, wherein the single RF source is provided for individually feeding RF power to the plurality of rungs and to at least one transversal antenna member via the at least one RF power divider.

12. The radio frequency antenna device as claimed in claim 1, wherein the rungs and the transversal antenna members are designed as TEM-type resonator strips.

13. A magnetic resonance imaging system, comprising:
   a main magnet for generating a substantially static magnetic field;
   a magnetic gradient coil system for generating gradient magnetic fields superimposed to the static magnetic field;
   an examination space provided to position a subject of interest within;

at least one RF antenna device as claimed in claim 1 that is provided for applying an RF field to the examination space to excite nuclei of the subject of interest.

14. A radio frequency antenna for applying an RF field to an examination space of a magnetic resonance (MR) imaging system, the RF antenna comprising:
- a plurality of electrically conductive rungs disposed substantially parallel and in a substantially equally spaced relationship around a central axis;
- a first group of electrically conductive transverse antenna members disposed within a plane that is substantially perpendicular to the plurality of rungs and disposed adjacent first ends of the rungs, the rungs and the transverse antenna members being mutually decoupled;
- a plurality of RF circuits, each rung and each transverse antenna member being associated with one of the RF circuits to be individually fed RF power thereby.

15. The radio frequency antenna as claimed in claim 14, further including:
- a second group of transverse antenna members disposed adjacent second ends of the rungs and parallel to the first group of transverse antenna members; and
- wherein the plurality of RF circuits includes an RF circuit for individually feeding RF power to each transverse antenna member of the second group of transverse antenna members.

16. The radio frequency antenna as claimed in claim 15, wherein a number of rungs of the plurality of rungs equals a number of transverse antenna members of the first group of transverse antenna members and also equals a number of transverse antenna members in the second group of transverse antenna members.

17. The radio frequency antenna as claimed in claim 15, wherein each of the RF circuits includes an RF source, the RF source being individually controlled with regard to RF amplitude, phase, frequency, and time.

18. The radio frequency antenna as claimed in claim 17, wherein the RF circuits are controllable to cause the radio frequency antenna to be driven as any one of a TEM coil, a birdcage coil, a combination of TEM and birdcage coil, and with an asymmetric field distribution in an axial direction.

19. The radio frequency antenna as claimed in claim 14, wherein the rungs and the transverse antenna members include TEM resonator strips.

20. A magnetic resonance imaging system, comprising:
- a main magnet for generating a substantially static magnetic field;
- a magnetic gradient coil system for generating gradient magnetic fields superimposed to the static magnetic field;
- an examination space provided to position a subject of interest within;
- at least one RF antenna as claimed in claim 15 that is provided for applying an RF field to the examination space to excite nuclei of the subject of interest.

* * * * *